US006870418B1

(12) United States Patent
Tang et al.

(10) Patent No.: US 6,870,418 B1
(45) Date of Patent: Mar. 22, 2005

(54) TEMPERATURE AND/OR PROCESS INDEPENDENT CURRENT GENERATION CIRCUIT

(75) Inventors: Stephen H. Tang, Pleasanton, CA (US); Siva G. Narendra, Portland, OR (US); Vivek K. De, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/747,084

(22) Filed: Dec. 30, 2003

(51) Int. Cl.[7] .............................................. H01L 35/00
(52) U.S. Cl. ....................................... 327/513; 327/543
(58) Field of Search .......................... 323/315; 327/512, 327/513, 530, 534, 535, 537, 538, 539, 543

(56) References Cited

U.S. PATENT DOCUMENTS 5,034,626 A * 7/1991 Pirez et al. ................. 327/542
5,349,286 A * 9/1994 Marshall et al. ............ 323/315
5,818,294 A * 10/1998 Ashmore, Jr. ............... 327/543
5,880,625 A * 3/1999 Park et al. .................. 327/543
6,107,868 A * 8/2000 Diniz et al. ................. 327/543

OTHER PUBLICATIONS

Stephen Tang. et al.; Temperature and Process Invariant MOS–based Reference Current Generation Circuits or Sub–1V Operation; ISLPED'03, Aug. 25–27, 2003, Seoul, Korea.

Siva Narendra, et al.; Sub–1 V Process–Compensated MOS Current Generation Without Voltage Reference; 2001 Symposium on VLSI Circuits Digest of Technical Papers pp. 143–144.

* cited by examiner

*Primary Examiner*—Jeffrey Zweizig
(74) *Attorney, Agent, or Firm*—Fleshner & Kim, LLP

(57) ABSTRACT

Embodiments of the present invention relate to current and/or voltage generation. The current and/or voltage generation may be process independent. Accordingly, variances in a manufacturing process will not substantially affect the ultimate current or voltage output from the circuit.

30 Claims, 13 Drawing Sheets

| $P_1$ AND $P_2$ SEPARATION | σ/μ ACROSS PROCESS | σ/μ ACROSS TEMPERATURE |
|---|---|---|
| 0.8σ | 1.5% | 1.6% |
| 2.4σ | 1.5% | 1.4% |
| 4.7σ | 1.5% | 1.8% |

| $P_1$ AND $P_2$ SEPARATION | σ/μ ACROSS PROCESS | σ/μ ACROSS TEMPERATURE |
|---|---|---|
| 0.8σ | 2.1% | 0.8% |
| 2.4σ | 2.0% | 1.2% |
| 4.7σ | 2.0% | 1.2% |

| CATEGORY | # OF COMBOS | $V_T$ SPREAD OF $P_1$, $P_2$ |
|---|---|---|
| A | 427 | $\Delta V_T < 1\sigma$ |
| B | 1764 | $1\sigma < \Delta V_T < 1.5\sigma$ |
| C | 1527 | $1.5\sigma < \Delta V_T < 2\sigma$ |
| D | 845 | $2\sigma < \Delta V_T < 2.5\sigma$ |
| E | 599 | $2.5\sigma < \Delta V_T < 3\sigma$ |
| F | 298 | $\Delta V_T > 3\sigma$ |

FIG. 14

TEMPERATURE AND/OR PROCESS INDEPENDENT CURRENT GENERATION CIRCUIT

BACKGROUND OF THE INVENTION

1. Field of the Invention

The field of embodiments of the invention relate to electronics.

2. Background of the Related Art

Electronics are very important to the lives of many people. In fact, electronics are present in almost all electrical devices (e.g. radios, televisions, toasters, and computers). It may be desirable for electronics to be designed as small as possible. Also, it may be desirable for electronics to operate as fast as possible. In fact, in some circumstances, electronics will operate faster when they are made smaller. Smaller devices may consume less power. Electronics that consume less power may also generate less heat. Electronics that generate less heat may operate at faster speeds. The speed of a electronic device may be a critical attribute governing its usefulness. For example, a computer which operates at a fast speed may be able to perform many different types of tasks (e.g. displaying moving video, making complex computations, and communicating with other devices) which a relatively slow computer may not be able to perform.

BRIEF DESCRIPTION OF THE DRAWINGS

FIG. 14 is an exemplary table of the breakdown of 5460 $P_1/P_2$ die combinations based on a spread of threshold voltages.

DETAILED DESCRIPTION OF PREFERRED EMBODIMENTS

Electrical hardware (e.g. a computer) may include many electrical devices. In fact, a computer may include millions of electrical devices (e.g. transistors, resistors, and capacitors). These electrical devices may work together in order for hardware to operate correctly. Accordingly, electrical devices of hardware may be electrically coupled together. This coupling may be either direct coupling (e.g. direct electrical connection) or indirect coupling (e.g. electrical communication through a series of components).

Figure 1:
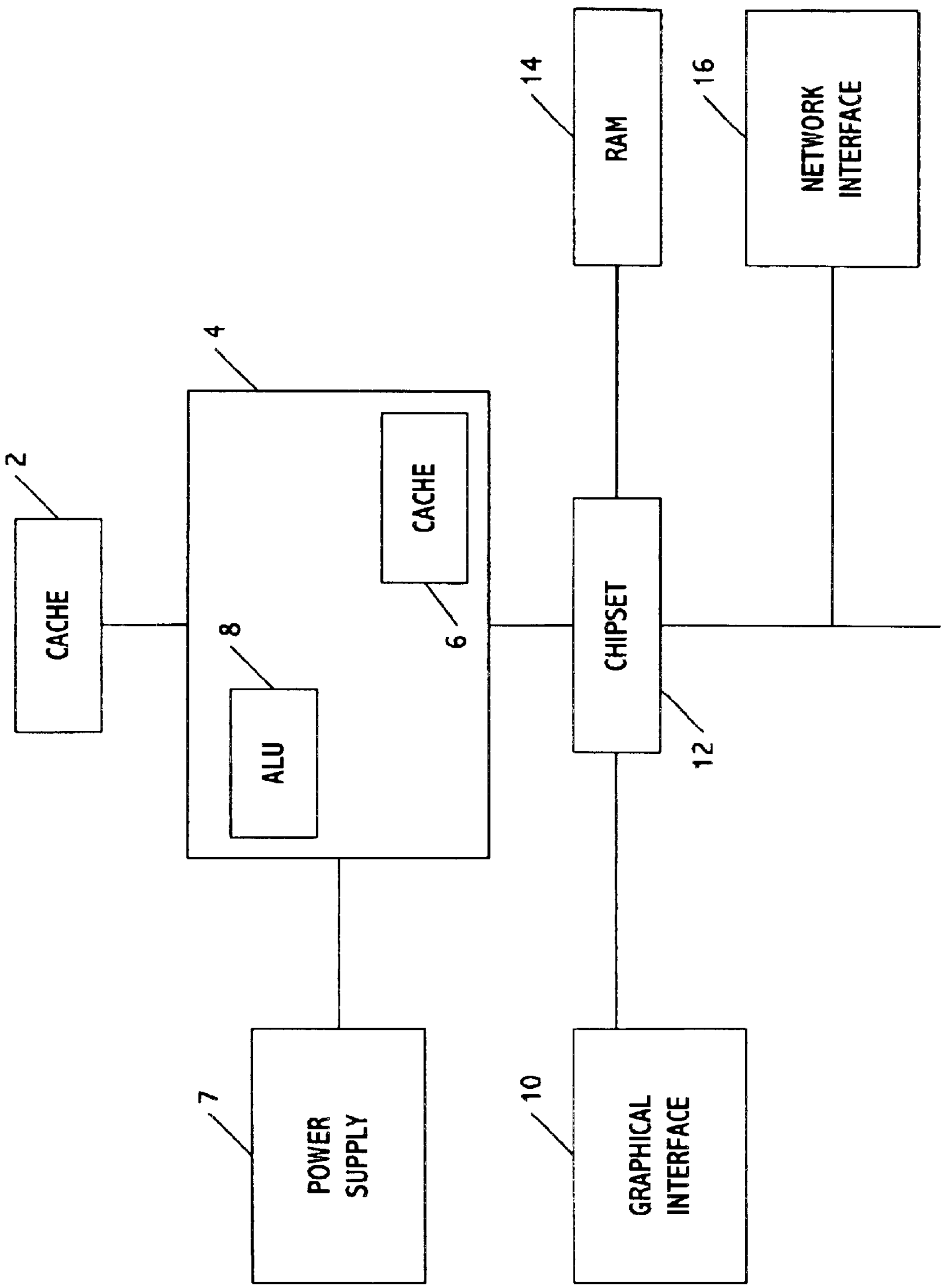
FIG. 1 is an exemplary global diagram of a portion of a computer.

FIG. 1 is an exemplary global illustration of a computer. The computer may include a processor 4, which acts as a brain of the computer. Processor 4 may be formed on a die. Processor 4 may include an Arithmetic Logic Unit (ALU) 8 and may be included on the same die as processor 4. ALU 8 may be able to perform continuous calculations in order for processor 4 to operate. Processor 4 may include cache memory 6 which may be for temporarily storing information. Cache memory 6 may be included on the same die as processor 4. Information stored in cache memory 6 may be readily available to ALU 8 for performing calculations.

As illustrated in exemplary FIG. 1, a computer may also include external cache memory 2 to supplement internal cache memory 6. Power supply 7 may be provided to supply energy to processor 4 and other components of a computer. A computer may include a chip set 12 coupled to processor 4. Chip set 12 may intermediately couple processor 4 to other components of the computer (e.g. graphical interface 10, Random Access Memory (RAM) 14, and/or a network interface 16). One exemplary purpose of chip set 12 is to manage communication between processor 4 and these other components. For example, graphical interface 10, RAM 14, and/or network interface 16 may be coupled to chip set 12.

Figure 2:
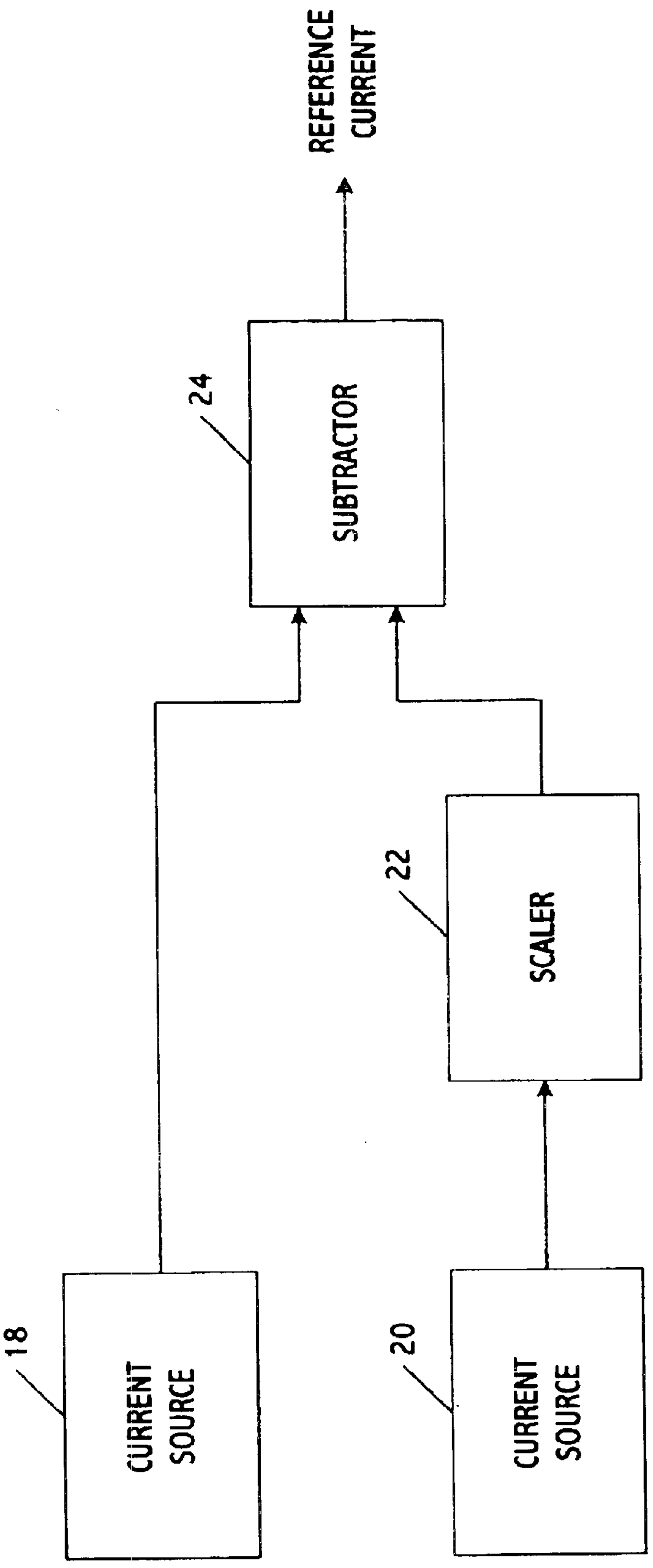
FIG. 2 is an exemplary illustration of two current sources, a scaler and a subtractor which generate a reference current.

FIG. 2 is an exemplary illustration of a substantially process compensated reference current generator. In embodiments of the present invention, a substantially process compensated reference current generator may include first current source 18, second current source 20, scaler 22, and/or subtractor 24. In embodiments, first current source 18 and second current source 20 are temperature-compensated current sources. In embodiments, current source 18 and current source 20 are configured to generate currents at different levels. During manufacturing of current source 18 and current source 20, which may be included on the same semiconductor die, there may be variation of the output current based on process variation.

Process variation may generally be considered the totality of circumstances which affect how semiconductor devices are made on a semiconductor substrate. For example, when several batches of semiconductor devices are made using semiconductor manufacturing equipment, there is some natural variances in materials, processes, and/or other environmental factors that may change the way first current source 18 and second current source 20 are made. These variances may affect the actual current level output by current source 18 and current source 20. Accordingly, it is desirable during manufacturing of current sources for a predictable current to be output. For example, when a microprocessor is manufactured, product specifications may require that a current source in the microprocessor generate a current of 50 mA. Process variation may frustrate consistent implementation of a current source outputting 50 mA and therefore limit the speed and/or usefulness of the microprocessor.

In embodiments, first current source 18 and second current source 20 may be manufactured at the same time, on the same semiconductor die. Accordingly, the same set of manufacturing circumstances may be present during the manufacturing of first current source 18 and second current source 20. In other words, current source 18 and current source 20 may be subject to the same process variation if they are manufactured on the same semiconductor substrate.

In embodiments, first current source 18 may be designed to have a higher or lower output current than current source 20. Although the currents output from first current source 18 and second current source 20, respectively, may vary due to variations in the process during manufacturing, one of the current sources (e.g. second current source 20) may be scaled and subtracted from the other current source (e.g. first current source 18) to generate a substantially process compensated reference current. This phenomenon may be possible because if process variation of a given semiconductor substrate raises or lowers first current source 18 to a higher or lower current level, then second current source 20 will also be raised or lowered proportionally. However, due to the fact that first current source 18 and second current source 20 are designed to output different current levels, the amount of actual current variation may differ between the two current sources. In embodiments, second current source 20 is scaled before being subtracted from first current source 18. The difference between scaled current source output from scaler 22 and output of first current source 18 may therefore be substantially the same reference current on different semiconductor substrates. In other words, process variation may be substantially compensated between different batches of semiconductor processing chips.

In embodiments, the scaling between first current source 20 and second current source 18 is linear. This linear scaling may be the result of a linear model based on empirical data. In embodiments, scaling by scaler 22 may be non-linear. The scaling of scaler 22 may be based, in embodiments, on either theoretical modeling or models based on empirical data.

Figure 3A:
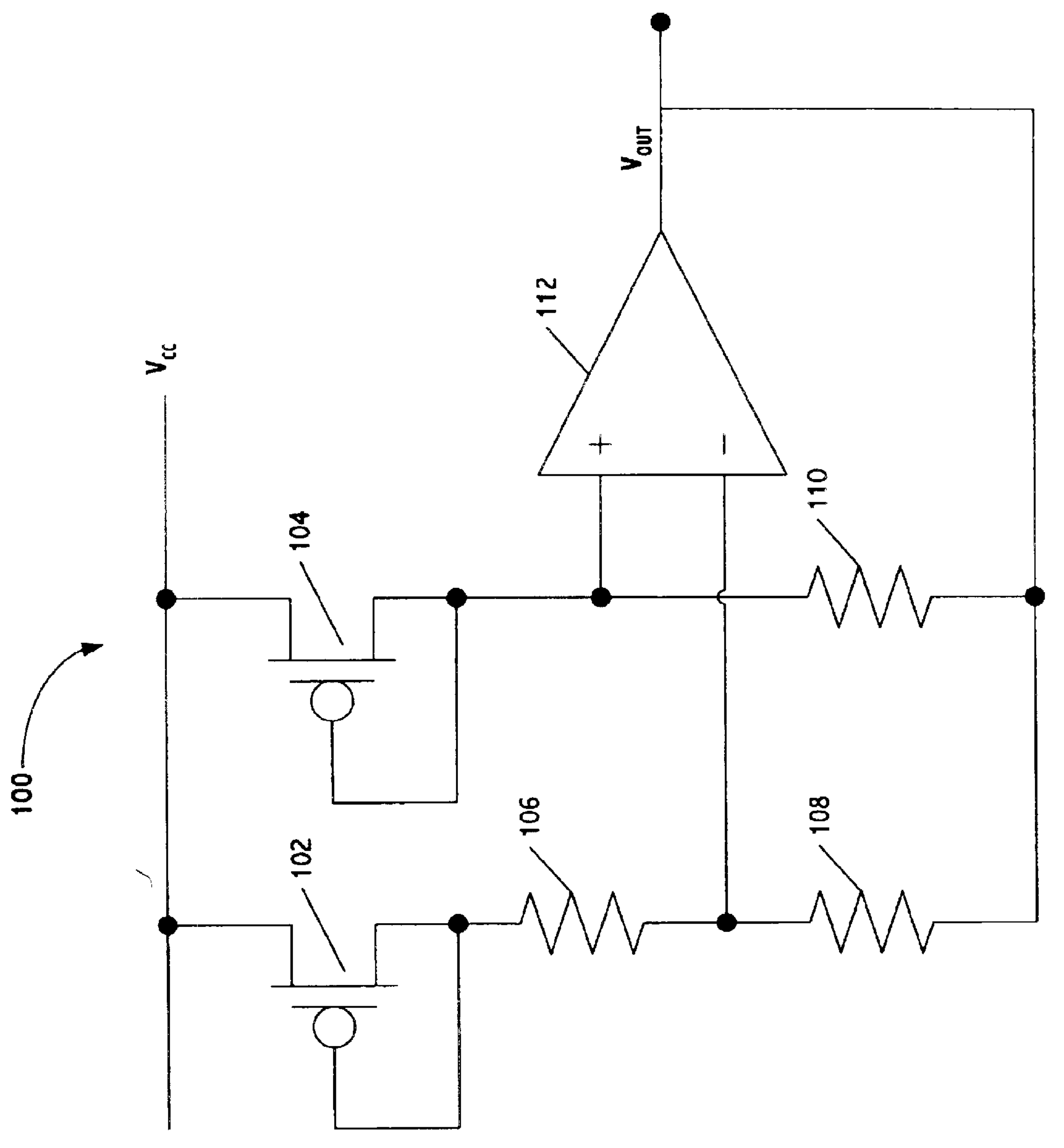
FIGS. 3A and 3B are exemplary circuits for generating a temperature compensated current.
Figure 3B:
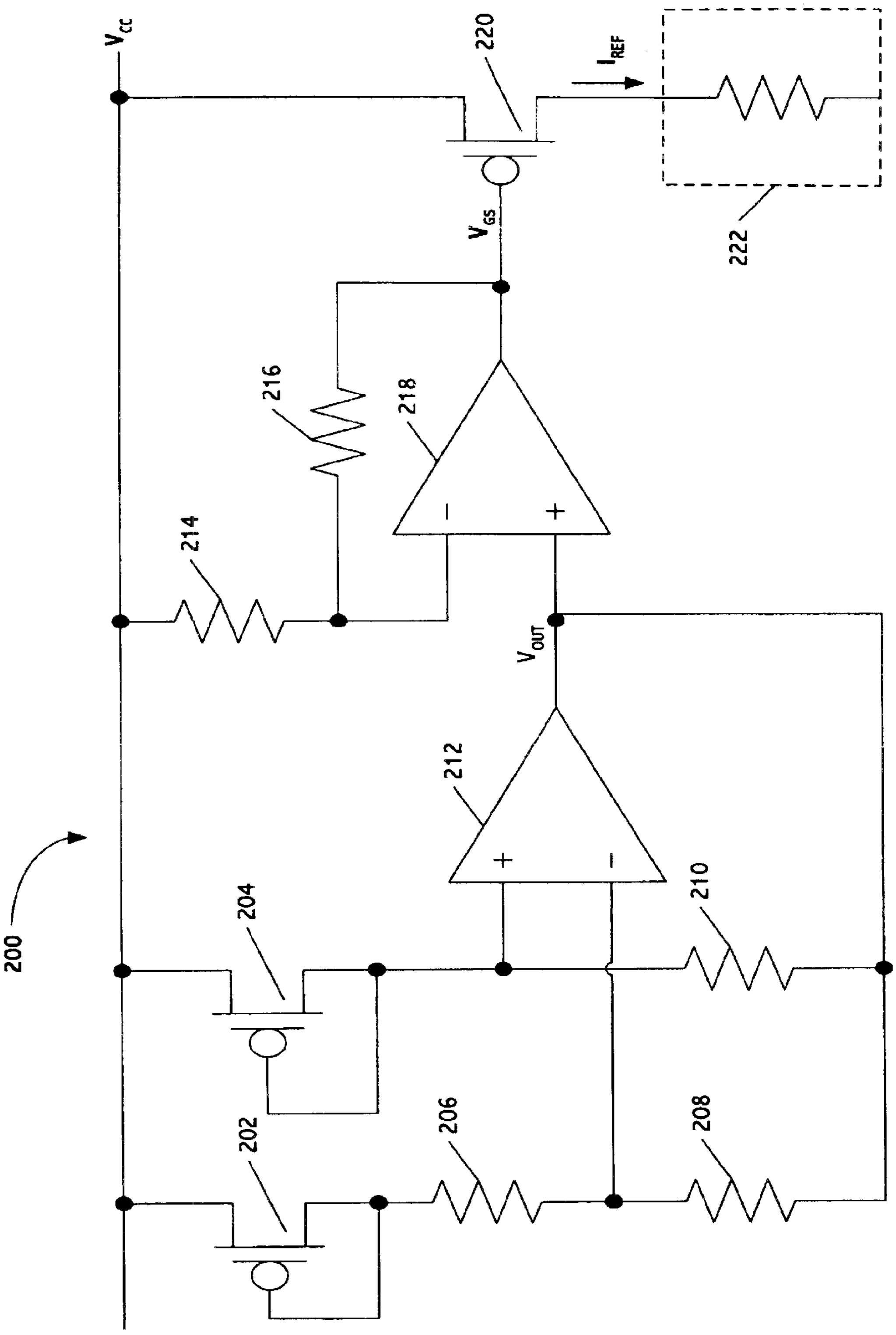

FIGS. 3A and 3B are exemplary illustrations of scaled MOS bandgap circuits that may generate a temperature compensated (e.g. temperature independent) current. In embodiments, the circuit illustrated in FIG. 3 may be implemented in either current source 18 or current source 20. FIG. 3A illustrates an exemplary bandgap circuit 100 which may be used to generate an output voltage ($V_{out}$) which is substantially only linearly dependent on variations in temperature.

Bandgap circuit 100 may include MOS transistors 102, 104 (depicted as p-channel MOS transistors) which may be configured to operate as diode-connected transistors (i.e., having their gate and drains shorted together). Because transistors 102, 104 may have their gates and drains shorted together, each remains biased in the saturation region so long as its gate-source voltage ($V_{gs}$) is less negative (or equal to) than its drain-source voltage ($V_{ds}$). While circuit 100 is shown implemented using p-channel MOSFETs, upon reading this disclosure, those skilled in the art will recognize that similar results may be attained by configuring circuit 100 (and circuit 200 discussed further below) using n-channel MOSFETs.

In embodiments, transistors 102 and 104 may each have a source connected to a voltage source (shown as a supply voltage $V_{cc}$). The drain of transistor 102 may coupled in series with resistors 106 and 108 (having resistances R3 and R2, respectively), while the drain of transistor 104 may be coupled in series with resistor 110 (having a resistance R1). Transistors 102 and 104 may be biased for operation in a subthreshold region, and may be generally matched to have substantially the same threshold voltage.

An amplifier 112 may be coupled to operate as a differential amplifier producing an output voltage ($V_{out}$) having a known temperature dependence which may be linearly dependent on variations in temperature. In particular, as depicted, amplifier 112 may be coupled in a feedback configuration where $V_{out}$ is coupled to inputs (+ and −) of amplifier 112 via resistors 108 and 110. In general, amplifier 112 may be selected to have sufficiently high gain to force the (+) and (−) inputs to be approximately equal and to reduce the impact of process variations in the fabrication of circuit 100.

The two inputs received by amplifier 112 may include a first input receiving a signal generated across resistor 110 and a second input receiving a signal generated across resistor 108. The values of resistors 106, 108 and 110 (whose resistances are referred to herein as resistances R3, R2, and R1, respectively) may be selected to introduce an extra voltage drop between MOS transistors 102, 104. In embodiments, resistor 108 is a variable resistor. By varying the resistance (R2) of resistor 108, as will be described further herein, various output characteristics of circuit 100 may be tuned. In embodiments, the resistances of resistors 106 and/or 110 may additionally (or alternatively) be varied to achieve desired output characteristics. In general, resistors 106, 108, and 110 may be sized based on characteristics of transistors 102, 104 to achieve voltage values at the (+) and (−) inputs of amplifier 112 which are substantially equal given a relatively high gain in amplifier 112.

In operation, bandgap circuit 100 may generate an output voltage $V_{out}$ having the form:

$$V_{out}=V_{to}+\alpha T. \qquad (1)$$

As shown in (1), and in the circuit of FIG. 3A, $V_{out}$ may be relatively resistant to variations in temperature because both $V_{to}$ and $\alpha$ are generally not dependent on temperature. In the circuit of FIG. 3A, $V_{to}$ is generally equal to the threshold voltage of transistors 102, 104 extrapolated to absolute zero temperature. In the circuit of FIG. 3A, $\alpha$ predominantly depends on the ratio of resistors R2/R1 and R2/R3. Accordingly, because $V_{to}$ and $\alpha$ are generally not dependent on temperature, $V_{out}$ is generated with a linear dependence on temperature. Further, in embodiments where one or more of resistors 106, 108, and 110 are variable, the output voltage ($V_{out}$) may be varied by varying the resistance. For example, the value of resistor 108 (resistance R2) may be varied to adjust or tune the output voltage as desired.

In some embodiments, the voltage output from circuit 100 may be passed directly to a MOS transistor in order to provide a current to a load. That is, circuit 100 may be utilized in applications in which traditional diode-based bandgap circuits are used. Circuit 100 may be suitable for use in environments having low supply voltages (e.g., including applications having supply voltages of approximately 1V or even lower).

Embodiments may allow the generation of a temperature-insensitive current by combining bandgap circuit with an amplifier stage as will now be described by reference to FIG. 3B. As shown in FIG. 3B, a current generation circuit 200 is shown which utilizes bandgap circuit 100 to generate an output current ($I_{ref}$) which is relatively temperature and supply voltage independent and which may be provided to a load device on-chip (e.g., without need to be routed to an external precision resistor prior to delivery to a load device).

Current generation circuit 200 may include a bandgap circuit portion (configured as described above in conjunction with FIG. 3A) including diode-configured, p-channel MOSFETs 202, 204 coupled to an amplifier 212 and resistors 206, 208 and 210 to provide an intermediate output voltage $V_{out}$) which is only linearly dependent on variations in temperature. The intermediate output voltage generated by the bandgap circuit portion is passed to an input of an amplifier 218 which is configured as a differential amplifier receiving a second input coupled to a resistor 214 (having a resistance R4) coupled to a supply voltage ($V_{cc}$) and to a resistor 216 (having a resistance R5) coupled to an output of amplifier 218. The output of amplifier 218 is coupled to a gate of a p-channel MOSFET transistor 220. Transistor 220 has a source coupled to the supply voltage ($V_{cc}$) and a drain coupled to a load 222.

In operation, circuit 200 functions to scale the intermediate output ($V_{out}$) from the bandgap portion of the circuit by a factor (k) using amplifier 218. The resulting output voltage presented at the gate of transistor 220 ($V_{gs220}$) is represented as:

$$V_{gs220}=kV_{to}+\alpha kT. \qquad (2)$$

Circuit 200 may be designed to generate a desired output voltage ($V_{gs220}$). For example, circuit 200 may be voltage matched by tuning the various resistor values to set $k=V_{ztc}/V_{to}$ and $\alpha=\beta/k^*(1-I_d/I_{ztc})$. Put another way, the output voltage at the gate of transistor 220 has the relationship:

$$V_{gs220}=-k(V_{to}+\alpha T), \text{ where } k=1+(R5/R4). \qquad (3)$$

The threshold voltages of each of the transistors 202, 204 and 220 may be matched to be substantially the same. The threshold voltage, as described above in conjunction with FIG. 3A, is selected to provide a desired drain current value at the zero temperature point of operation. The temperature-independent current generated by circuit 200 is the drain current of transistor 220. Transistor 220 may be maintained in saturation mode by designing load 222 to keep $V_{ds220}$ greater than $V_{gs220}-V_T$.

Circuit 200 may be tuned to provide a desired temperature-independent current to load 222 by tuning one of two variables of equation (3): the variable k or the variable α. In some embodiments, k is generally fixed as a design choice (e.g., by the selection of the ratio of resistances R5/R4 as described in eq. (3) above), and the variable α is tuned by varying the resistance of one of the resistors of circuit 200. For example, as described above in conjunction with the circuit of FIG. 3A, one or more of the resistors in the bandgap circuit portion may be implemented as variable resistors, allowing the tuning of the variable α. In some embodiments, resistor 208 is implemented as a variable resistor and its resistance may be varied to change the variable α. By varying α, the voltage applied to the gate of MOS transistor 220 may be varied to achieve a zero temperature voltage which results in the generation of a zero temperature current. In some embodiments, other voltages which are linearly dependent on temperature may be selected to provide temperature-insensitive currents (e.g., there may be a number of linearly-dependent gate voltages which may result in temperature-insensitive currents and providing desired characteristics). Other resistances in circuit 200 may also be varied to achieve desired tuning of α.

When a zero temperature coefficient voltage ($V_{ZTC}$) is applied to a gate of MOS transistor 220, a zero temperature coefficient current ($V_{ZTC}$) may be generated. This temperature-independent current may be delivered on-chip to a load such as load 222 without need for off-chip precision resistors or the like. Load 222 may be any of a number of different types of loads, such as, for example, circuits using a differential pair configuration as a gain stage (e.g., such as an amplifier), a current mirror (e.g., to distribute the current to other circuits), or the like. Other loads may also beneficially utilize the temperature-independent current generated using circuit 200. Because no off-chip precision resistors are needed, designs using circuit 200 may be manufactured with fewer pins.

Figure 4:
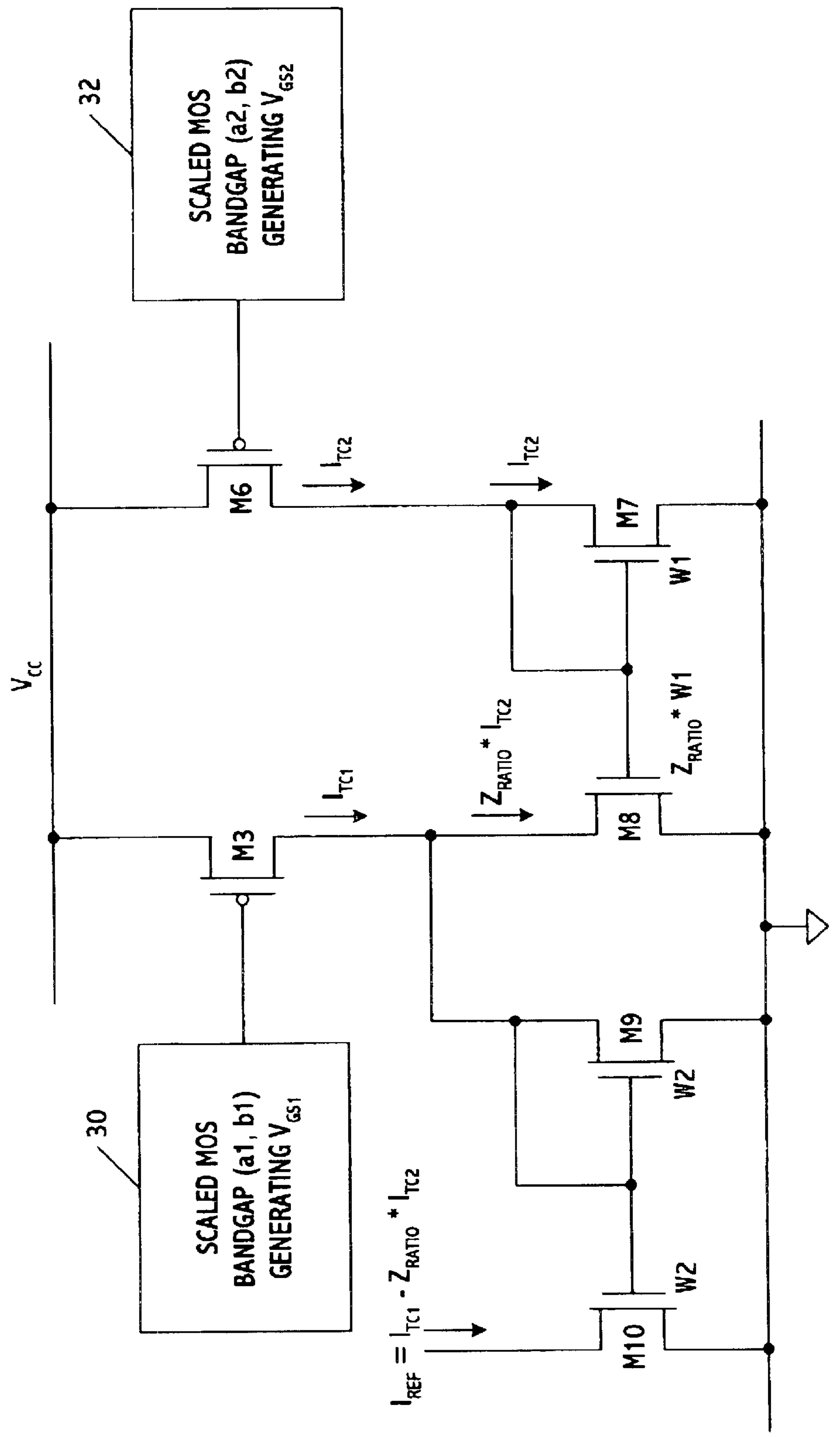
FIG. 4 is an exemplary circuit illustrating current mirrors that perform current scaling and subtraction to generate a process compensated reference current

A circuit that scales and subtracts the current using current mirrors, in accordance with embodiments of the present invention, is illustrated in FIG. 4. To achieve process compensation, $I_{TC2}$ may be scaled and subtracted from $I_{TC1}$, so that $I_{REF}=I_{TC1}-Z_{RATIO}*I_{TC2}$. Solving the expression that equates the current at the two extremes of process may yield a value of $Z_{RATIO}$, which may be the scaling factor for $I_{TC2}$.

Achieving substantial process and temperature insensitivity in a current reference, that does not use an external resistor, is desirable. Because the circuit does not require an external resistor, there is no need to use valuable pins on a chip that can be used for other purposes. Accordingly, the total size of a current generation circuit may be minimized. Current reference circuit illustrated in FIG. 4 and in accordance with embodiments of the present invention may be sufficiently small and therefore may be placed at multiple places on a die. Since no diodes are used, the circuit of FIG. 4 may be scalable to supply voltages below 1V.

Figure 5:
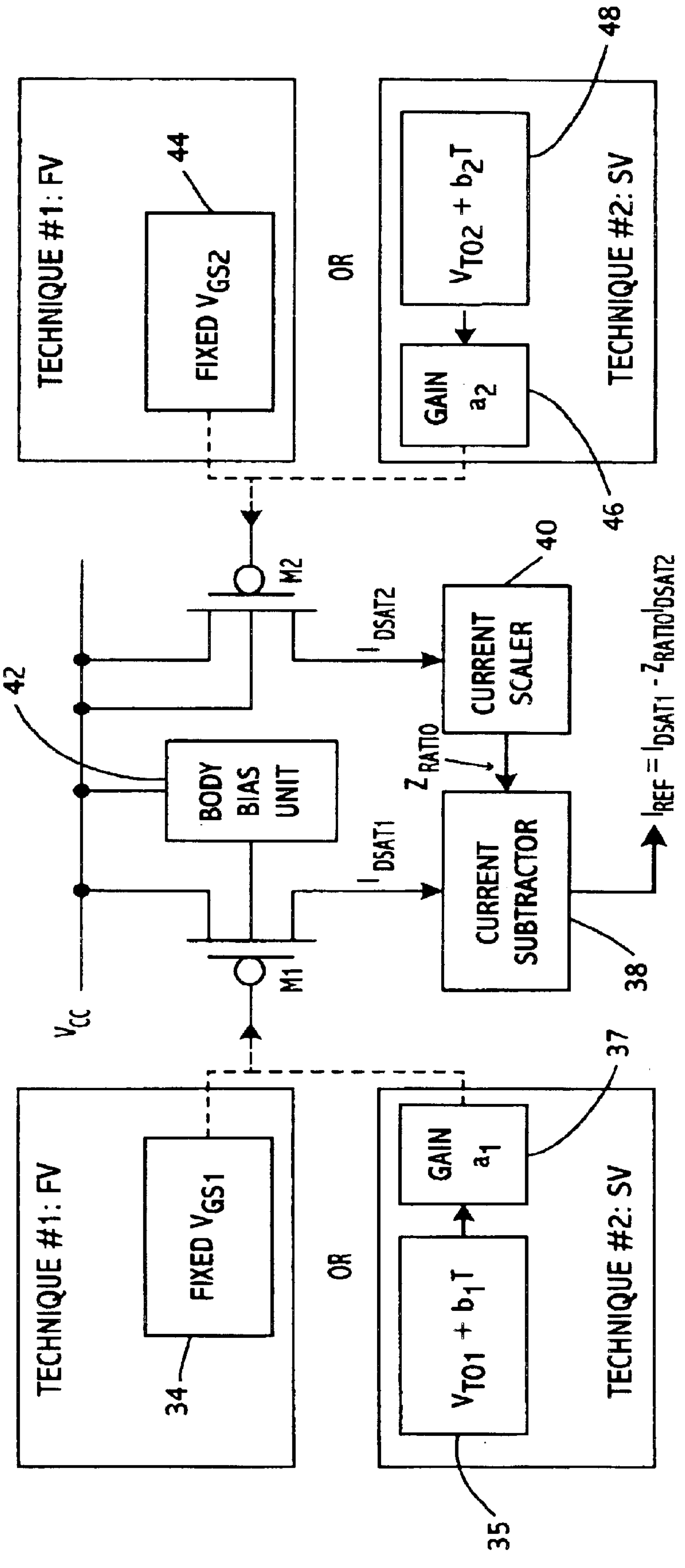
FIG. 5 is an exemplary illustration of techniques for reference current generation.

FIG. 5 illustrates embodiments of the present invention that relate to MOS reference current generator circuits that provide immunity against both temperature and process variations in low-voltage, deep-submicron CMOS technologies. These current generator circuits do not require an off-chip resistor and the reference currents can be generated locally in different parts of the chip. A fixed-voltage (FV) technique may use constant voltage generators derived from scaled-bandgap voltage reference circuits. A scaled-$V_{TO}$ (SV) technique, where $V_{TO}$ is the device threshold voltage at absolute zero temperature, may not require voltage references. Both of these techniques use current-based subtraction. They may be implemented on a prototype chip in a 150 nm logic process technology.

Figure 6:
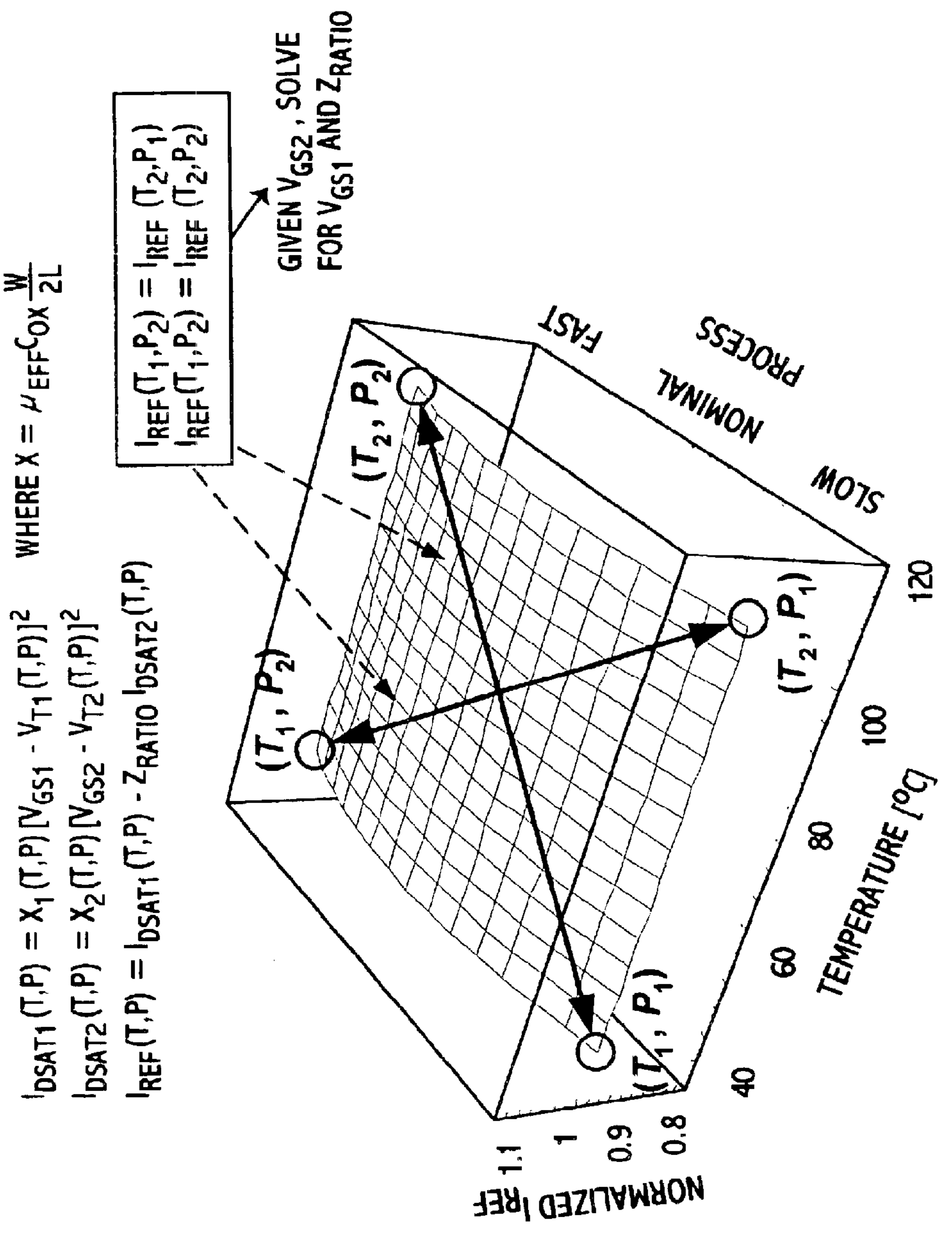
FIGS. 6 and 7 are exemplary illustrations of a theory for temperature and process compensation in reference current generation.

In embodiments, long channel devices may be used in reference current generators to provide square-law saturation drain current ($I_{DSAT}$) characteristics and minimize impact of critical dimension (CD) variations on device parameters. A theory for the FV scheme is illustrated, in accordance with embodiments of the present invention, in FIG. 6. Forward body bias may be applied to one of the transistors in a matched pair to introduce a "controllable" difference in their threshold voltages ($V_T$) and effective mobilities ($\mu_{EFF}$). The two devices in the pair, operating in the saturation region, may also receive different gate-to-source bias values ($V_{GS1}$ and $V_{GS2}$) generated by scaled-bandgap voltage references. $I_{DSAT}$ of one of the devices may be scaled by a factor ($Z_{RATIO}$) and subtracted from that of the other device to produce reference current ($I_{REF}$). For a given value of $V_{GS2}$, $V_{GS1}$ and $Z_{RATIO}$ may be solved such that $I_{REF}$ values at opposite corners of temperature (T) and process (P) range are equal, as illustrated, in accordance with embodiments, in FIG. 6. This "trimming" of $V_{GS1}$ and $Z_{RATIO}$ values may require I-V (saturated drain current vs. gate voltage) measurements of the matched device pair, one with zero body bias and the other with forward body bias, on two different dies ($P_1$ & $P_2$) at two different temperatures $T_1$ & $T_2$).

Figure 7:
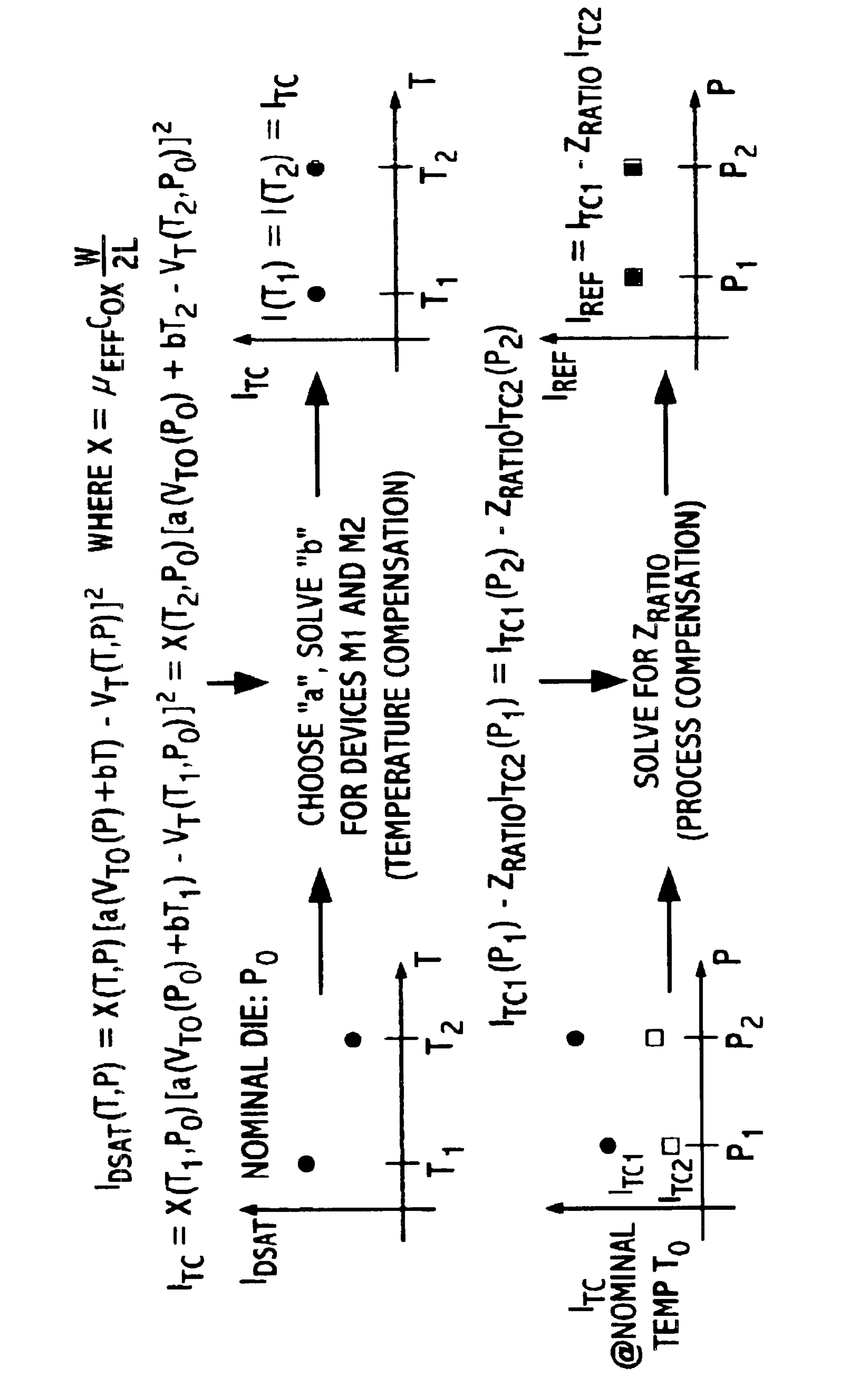

FIG. 7 is an exemplary illustration of a theory for a SV technique, in accordance with embodiments of the present invention. Temperature and process compensations may be accomplished in two steps. Each device in a matched pair may use a $V_{TO}$-generator circuit that produces an output voltage $V_{TO}$+bT with scalable temperature-coefficient "b". The output voltage may be scaled by a factor "a" to generate gate-to-source bias ($V_{GS}$) that automatically tracks changes in $V_T$ of the device across process. For a given value of "a", the temperature-coefficient "b" may be solved to produce equal $I_{DSAT}$ values at two different temperatures ($T_1$ & $T_2$).

Both devices in the matched pair may have zero body bias, but may use different combinations of (a, b) to achieve two temperature-invariant currents. Temperature-compensated current ($I_{TC2}$) of one of the devices may then be scaled by a factor $Z_{RATIO}$ and subtracted from that of the other device ($I_{TC1}$) to produce reference current $I_{REF}$. In embodiments, to achieve process compensation in addition to temperature invariance, a value of $Z_{RATIO}$ may be solved such that $I_{REF}$ values at two different process corners ($P_1$ & $P_2$) are equal. This "trimming" of $Z_{RATIO}$ and ($b_1$, $b_2$) values for the device pair requires transistor I-V measurements on a nominal die ($P_0$) at two different temperatures ($T_1$ & $T_2$) and on two other dies ($P_1$ & $P_2$) at nominal temperature ($T_0$).

Figure 8:
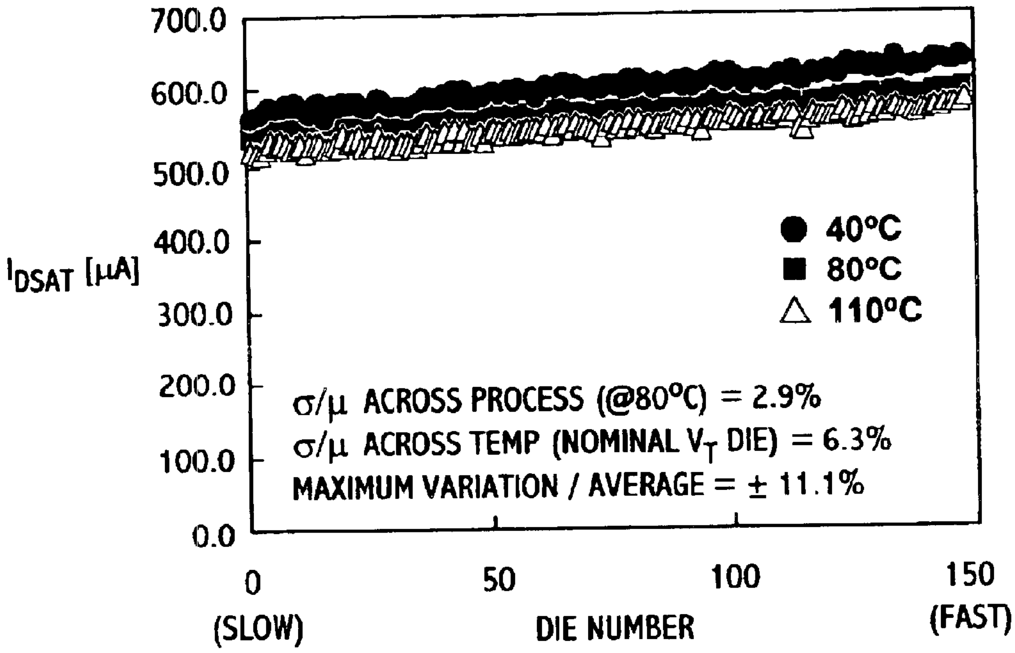
FIG. 8 is exemplary data of an uncompensated reference current.

FIG. 8 illustrates exemplary experimental data for $I_{DSAT}$ of 40 μm/1 μm W/L transistors with constant 0.8V $V_{GS}$, measured on 148 dies across two wafers, showing ±11% maximum variation across process and temperature (40° C. to 110° C.). In FIG. 8, the x-axis represents "process" by sorting dies based on their $V_T$ extracted at 810° C. from high $V_T$ (slow die) to low $V_T$ (fast die). When gate bias is larger than $V_T$, the mobility may dominate saturation current. Accordingly, as mobility decreases with increasing temperature, so does the current.

Figure 9:
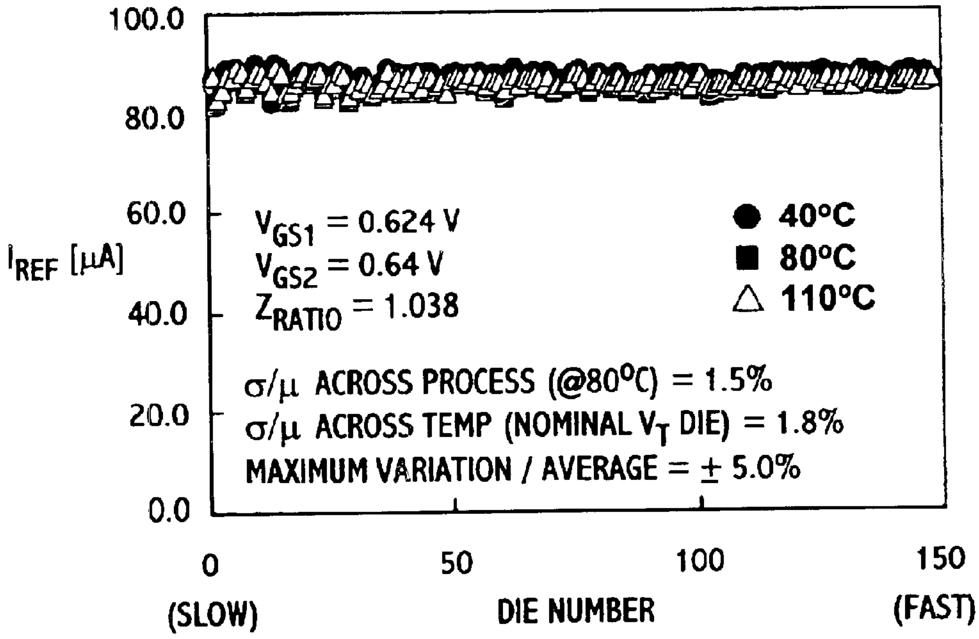
FIGS. 9–11 are exemplary illustrations of data of a process and temperature compensated reference current.

For a FV scheme, 500 mV forward body bias may be applied to one of the devices in the matched pair. Values of $V_{GS1}$ and $Z_{RATIO}$ may be determined from a theory by fixing $V_{GS2}$ (in this case at 0.64V) and solving the two coupled equations in FIG. 6. The $V_T$ and X values to be used may be extracted from I-V data measured at 40° C. and 110° C. on two dies at the extremes of the process range (the dies with the highest and lowest $V_T$ values). In accordance with the exemplary experimental data, maximum variation of the resulting process- and temperature-compensated reference current is only ±5%, compared to ±11% variation in the uncompensated $I_{DSAT}$ (illustrated in FIG. 9).

Figure 10:
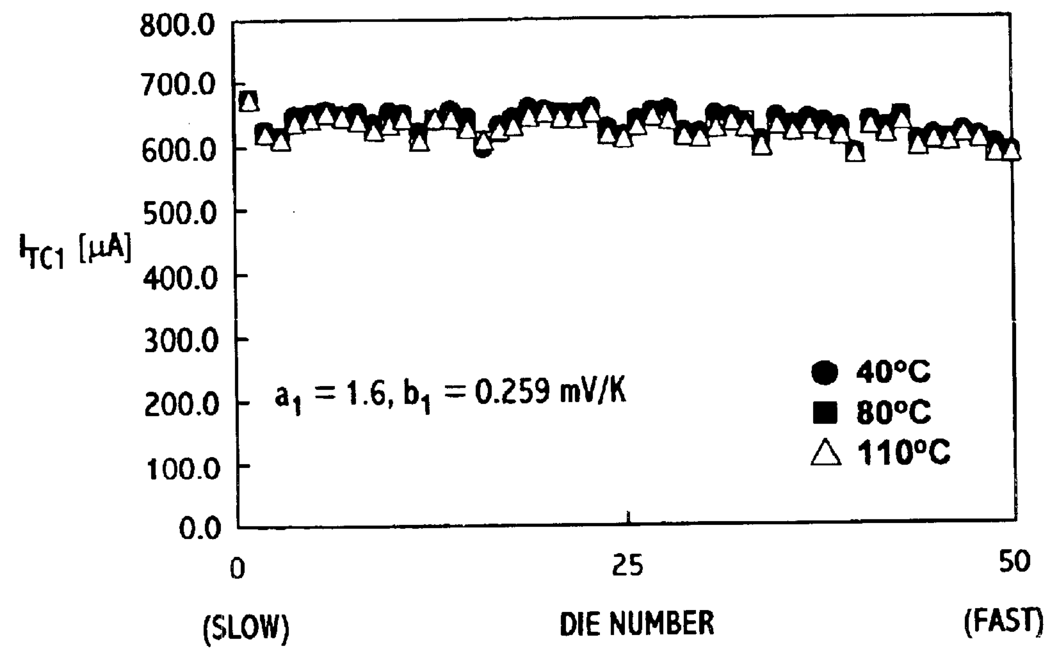
Figure 11:
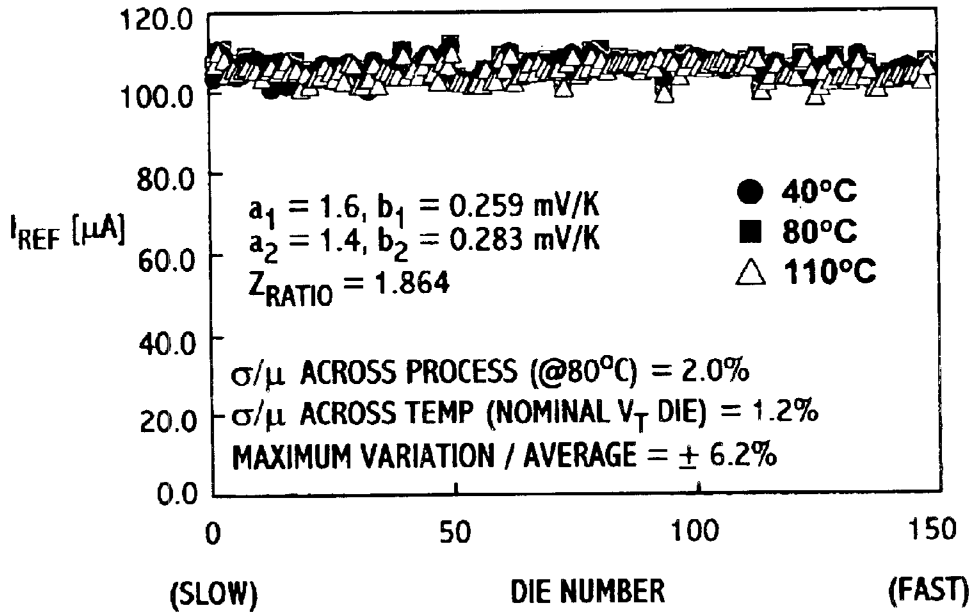

In a SV technique, values of $b_1$ and $b_2$ for the matched device pair, which may require temperature compensation, may be determined from the theory by choosing values for $a_1$ and $a_2$ and solving the quadratic equation for $I_{TC}$ from the top half of FIG. 7. The $V_T$, $V_{TO}$, and X values to be used may be extracted from measured I-V data of devices on a nominal die at 40° C. and 110° C. Note that the temperature compensation remains effective for all dies across the process range, even though the "trimming" of $b_1$ and $b_2$ values is based on device characteristics of a nominal die. This may be due to the fact that the $V_{TO}$-generator automatically compensates for some process variation, as demonstrated in exemplary experimental data of FIG. 10. For each die, the currents at 40, 80, and 110° C. nearly overlap. Because of the near ideal temperature compensation of the SV technique, $\sigma/\mu$ of the resulting $I_{TC}$ is 1% across temperature, compared to 6% for the uncompensated $I_{DSAT}$. To achieve process compensation in the SV technique, the $Z_{RATIO}$ value may be determined by solving the equation in the middle of FIG. 7 using the measured $I_{TC1}$ and $I_{TC2}$ from two dies at the extremes of the process range 80° C. Maximum variation of the resulting process- and temperature-compensated reference current is only ±6%, in accordance with the exemplary experimental data of FIG. 11.

Figure 12:
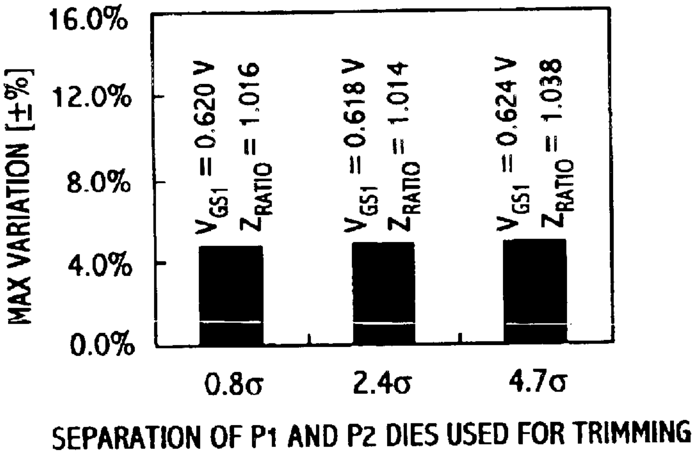
FIGS. 12 and 13 are exemplary illustrations of data representing sensitivity of reference current variation.

Both FV and SV techniques may only compensate for linear components of variation across process and temperature. The residual variation may be primarily a non-linear component, which may be very sensitive to the choice of dies representing $P_1$ and $P_2$. In some of the exemplary experimental data, a total of 148 dies were measured. The comparisons of the FV and SV techniques, according to the exemplary data, to the uncompensated current consider only the best case since they assume that the slowest ($P_1$, with highest $V_T$) and fastest ($P_2$, and lowest $V_T$) dies in the entire 148-die population are known a priori. Dies chosen to represent $P_1$ and $P_2$ depend on the available die samples; more samples lead to a wider range and more accurate representation of the process distribution. To simulate the effect a limited number samples has on the achievable compensation, two arbitrary combinations of $P_1$ and $P_2$ were chosen and the spread in $V_T$ of each combination was measured. The result $I_{REF}$ variations for the two $P_1/P_2$ combinations, along with the original best case are shown in FIG. 12 (for FV) and FIG. 13 (for SV). "σ" in the x-axis is the standard deviation of $V_T$ across all 148 dies and is used as the unit for process spread. These figures show little sensitivity of $I_{REF}$ variation to the process spread between $P_1$ and $P_2$.

Figure 13:
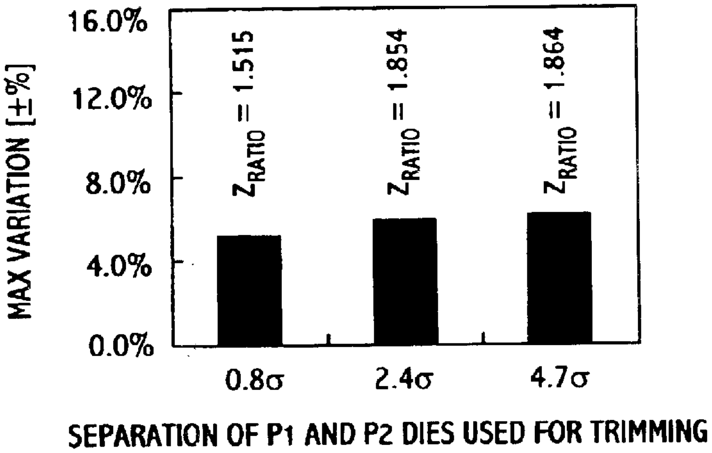
Figure 15:
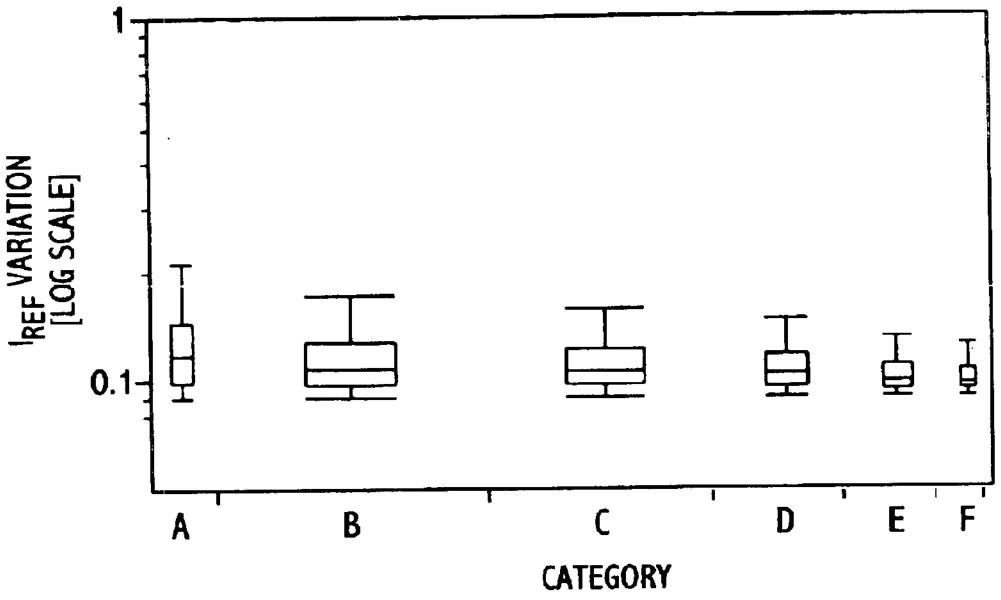
FIGS. 15 and 16 are exemplary box-plots of reference current variations.
Figure 16:
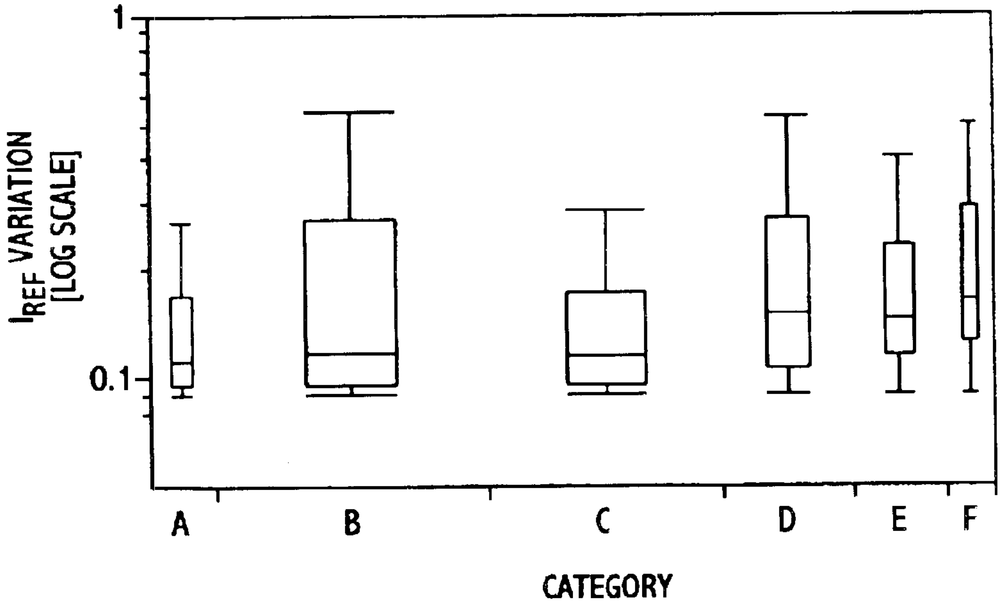

FIGS. 12 and 13 show singular examples of $P_1/P_2$ combinations. 148 dies actually yield 10878 $P_1/P_2$ combinations. For a statistical study, 5460 of these combinations were chosen. The spread in $V_T$ of each combination was measured and grouped into categories in FIG. 14. The FV and SV techniques were then applied to the entire 148-die population 5460 times by solving the respective equations for each $P_1$ and $P_2$ combination. The resulting distributions of reference current variations for each category are depicted as box-plots in exemplary data FIGS. 15 and 16. FIG. 15 shows that the FV technique continuously lowers $I_{REF}$ variation as the available process spread increases since both the medians and inter-quartile distances reduce. Conversely, there is no trend of improvement in the exemplary experimental data for the SV technique as available spread increases. The difference may be that FV performs process and temperature compensation simultaneously, via the coupled equations, whereas SV compensates for temperature and then process in separate steps.

As demonstrated in exemplary FIGS. 12 and 13, both techniques can succeed if the right $P_1$ and $P_2$ combination is chosen. According to exemplary experimental data box-plots, there may be about a 25% chance that a $P_1/P_2$ combination will yield less than ±5% variation for both SV and FV (except for categories D, E and F for SV). Statistically, the FV technique may be more likely to result in an $I_{REF}$ with low variation. In the SV technique, there may be a much higher chance that the resulting $I_{REF}$ could have even larger variation than the uncompensated current (see the top ticks of the box-plots in FIG. 16, which mark the ninetieth percentiles).

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An apparatus configured to generate a reference current, wherein the apparatus comprises:

a first current source generating a first current;

a second current source generating a second current; and a scaler scaling the second current to generate a scaled current, wherein:

the reference current is a difference between the first current and the scaled current; and at least one of the first current source and the second current source is a substantially temperature independent current source.

2. The apparatus of claim 1, wherein the reference current is a substantially process independent current.

3. The apparatus of claim 2, wherein the reference current is a substantially temperature independent current.

4. The apparatus of claim 1, wherein at least one of the first current source and the second current source utilize a scaled threshold voltage technique.

5. The apparatus of claim 1, wherein the first current source and the second current source are on the same semiconductor substrate.

6. The apparatus of claim 1, wherein the first current and the second current are different current levels.

7. The apparatus of claim 1, wherein the first current is larger than the second current.

8. The apparatus of claim 1, wherein the reference current is a difference of the scaled current from the first current.

9. The apparatus of claim 1, wherein the scaler scales the second current by at least one predetermined parameter.

10. The apparatus of claim 9, wherein said at least one predetermined parameter is determined empirically according to effect of process variation on current sources on a semiconductor substrate.

11. The apparatus of claim 9, wherein said at least one predetermined parameter corresponds to a linear model of process variation of the first current and the second current.

12. The apparatus of claim 1, wherein the scaler is a first current mirror.

13. The apparatus of claim 12, wherein the first current mirror comprises a first transistor and a second transistor, wherein:

a channel interface of the first transistor is coupled to the first current source;

a channel interface of the second transistor is coupled to the second current source;

a gate of the first transistor is coupled to a gate of the second transistor and the channel interface of the second transistor;

width of channel of the first transistor is larger than width of channel of the second transistor; and the reference current is output at the interface of the first current source and the first transistor.

14. The apparatus of claim 13, wherein the reference current output from the interface of the first current source and the first transistor is input into a second current mirror.

15. An method comprising generating a reference current, comprising:

generating a first current at a first current source;

generating a second current at a second current source; and scaling the second current to generate a scaled current at a scaler, wherein:

the reference current is a difference between the first current and the scaled current; and at least one of the first current source and the second current source is a substantially temperature independent current source.

16. The method of claim 15, wherein the reference current is a substantially process independent current.

17. The method of claim 16, wherein the reference current is a substantially temperature independent current.

18. The method of claim 15, wherein at least one of the first current source and the second current source utilize a scaled threshold voltage technique.

19. The method of claim 15, wherein the first current source and the second current source are manufactured on the same semiconductor substrate.

20. The method of claim 15, wherein the first current and the second current are different current levels.

21. The method of claim 15, wherein the first current is larger than the second current.

22. The method of claim 15, wherein the reference current is a difference of the scaled current from the first current.

23. The method of claim 15, wherein the scaler scales the second current by at least one predetermined parameter.

24. The method of claim 23, wherein said at least one predetermined parameter is determined empirically according to effect of process variation on current sources on a semiconductor substrate.

25. The method of claim 23, wherein said at least one predetermined parameter corresponds to a linear model of process variation of the first current and the second current.

26. The method of claim 15, wherein the scaler is a first current mirror.

27. The method of claim 26, wherein the first current mirror comprises a first transistor and a second transistor, wherein:

a channel interface of the first transistor is coupled to the first current source;

a channel interface of the second transistor is coupled to the second current source;

a gate of the first transistor is coupled to a gate of the second transistor and the channel interface of the second transistor;

width of channel of the first transistor is larger than width of channel of the second transistor; and the reference current is output at the interface of the first current source and the first transistor.

28. The apparatus of claim 27, wherein the reference current output from the interface of the first current source and the first transistor is input into a second current mirror.

29. A system comprising:

a die comprising a processor; and an off-die component in communication with the processor;

wherein the processor is configured to generate a reference current, wherein the processor comprises:

a first current source generating a first current;

a second current source generating a second current;

a scaler scaling the second current to generate a scaled current, wherein:

the reference current is a difference between the first current and the scaled current; and at least one of the first current source and the second current source is a substantially temperature independent current source.

30. The system of claim 29, wherein the off-die component is at least one of a cache memory, a chip set, and a graphical interface.

* * * * *